May 5, 1970 D. L. WOLLESEN 3,510,788

SELF-OSCILLATING FM DETECTOR USING FIELD-EFFECT TRANSISTORS

Filed Jan. 9, 1967

INVENTOR.
Donald L. Wollesen

BY

Mueller, Aichele & Rauner

ATTY'S.

United States Patent Office 3,510,788
Patented May 5, 1970

3,510,788
SELF-OSCILLATING FM DETECTOR USING FIELD-EFFECT TRANSISTORS

Donald L. Wollesen, Scottsdale, Ariz., assignor to Motorola, Inc., Franklin Park, Ill., a corporation of Illinois Filed Jan. 9, 1967, Ser. No. 608,023
Int. Cl. H03d *1/14*
U.S. Cl. 329—124 6 Claims

ABSTRACT OF THE DISCLOSURE

A quadrature FM detector circuit using either a pair of cascode connected junction field-effect transistors, a single, multiple gate junction field-effect transistor, or a single multiple gate insulated gate field-effect transistor to provide a product detection in response to phase variations about the quadrature point with frequency modulation of the input signal. This product detection produces detectable amplitude variations at the output of the field-effect transistor(s).

This invention relates generally to FM detectors and more particularly to a self-oscillating FM detector employing field-effect transistors in a novel FM quadrature circuit configuration.

Background of the invention

Quadrature FM detectors using vacuum tubes and bipolar transistors are well known. These detectors operate on the principle of beating the incoming FM signal with a locally generated signal and detecting phase variations between the two signals as the incoming carrier signal is frequency modulated. Vacuum tube FM detector circuits, however, possess the obvious and ever present inherent disadvantages associated with the requirement for a filament power supply, and additionally, vacuum tubes are known to introduce a substantial amount of harmonic distortion into the detected signal in the process of quadrature detection. FM detectors using bipolar tetrode transistors, while not plagued with problems relating to a vacuum tube filament power supply, are nevertheless relatively insensitive to frequency variations in the incoming FM signal since a signal applied to either of the two base electrodes of the bipolar tetrode transistor is incapable of independently turning off the bipolar transistor if the other base electrode is forward biased. This characteristic of the bipolar tetrode transistor makes this type of transistor a very poor switch and renders FM detectors which use these bipolar devices relatively insensitive detector circuits.

There is also a well known device analogy between a field-effect transistor and a vacuum tube pentode. For example, it is well known that there are similarities in the voltage-current transfer characteristics of the field-effect transistor and the vacuum tube pentode; another similarity between these two devices is that they are both voltage controlled devices having a high input impedance. However, this device analogy has failed to teach the art how field-effect transistors may be connected in an FM detector circuit arrangement of the type to be described. This general device analogy has failed to make obvious to one skilled in the art an FET FM detector circuit having a minimum of circuit components, a detector circuit which is operative to introduce a minimum of harmonic distortion in the detection process and a detector circuit which may be operated equally well with insulated gate field-effect transistors as with junction field-effect transistors.

Summary of the invention

An object of this invention is to provide a new and improved FM detector circuit arrangement using field-effect transistors.

Another object of this invention is to provide a new and improved FM product detector circuit which requires a low operating power and introduces a very low amount of harmonic distortion into the incoming signal during the detection process.

The present invention features a self-oscillating FM quadrature detector circuit having a pair of serially connected junction field-effect transistors (JFET's) connected in a cascode arrangement with one of the JFET's connected in a Colpitts oscillator configuration. The other JFET is connected to resonate in phase quadrature with local oscillations produced by the one JFET so that with no frequency modulation impressed on the incoming signal, the oscillations produced by the Colpitts oscillator configuration and the resonating signal introduced into the other JFET are in phase quadrature. During frequency modulation of the incoming signal, the above signals will vary about the phase quadrature point and a product detection is brought about by the signal interaction in the two cascode connected JFET's. This product detection action produces a variable conduction angle signal in accordance with the frequency modulation impressed on the input carrier signal, and this variable conduction angle signal is thereafter integrated to provide a detectable audio output.

Another feature of this invention is the provision of an FET cascode connection wherein two junction field-effect transistors may be replaced by either a single insulated gate "series tetrode" field-effect transistor or a single junction gate "series tetrode" field-effect transistor. These "series tetrode" transistors can be built on a single on a single chip of semiconductor material, and in the series tetrode insulated gate field-effect transistor two channels are connected in series with a common source and drain region located between the two series connected channels.

Briefly, this invention is directed to a self-oscillating FM product detector which includes a first field-effect transistor connected in a Colpitts type oscillator circuit to receive an incoming frequency modulated signal. The first field-effect transistor is connected in cascode with a second field-effect transistor and this second field-effect transistor is connected in a separate resonant circuit. This resonant circuit resonates at the same frequency as the Colpitts oscillator circuit and in phase quadrature therewith with no modulation impressed on the incoming signal. A feedback circuit connection is provided between the resonant circuit and the first field-effect transistor to provide local oscillations at the first junction field-effect transistor. As the incoming signal which is applied to the input gate of the first field-effect transistor is frequency modulated, the above quadrature relationship varies about a ninety degree phase difference point and produces a product interaction in the current flow in the cascode connection between the two field-effect transistors. The variation in phase relationship about the ninety degree or quadrature point is reflected as a conduction angle variation in the output signal of the second field-effect transistor, and this conduction angle variation is integrated to provide a useable audio output signal.

Description of the preferred embodiment

Figure 1:
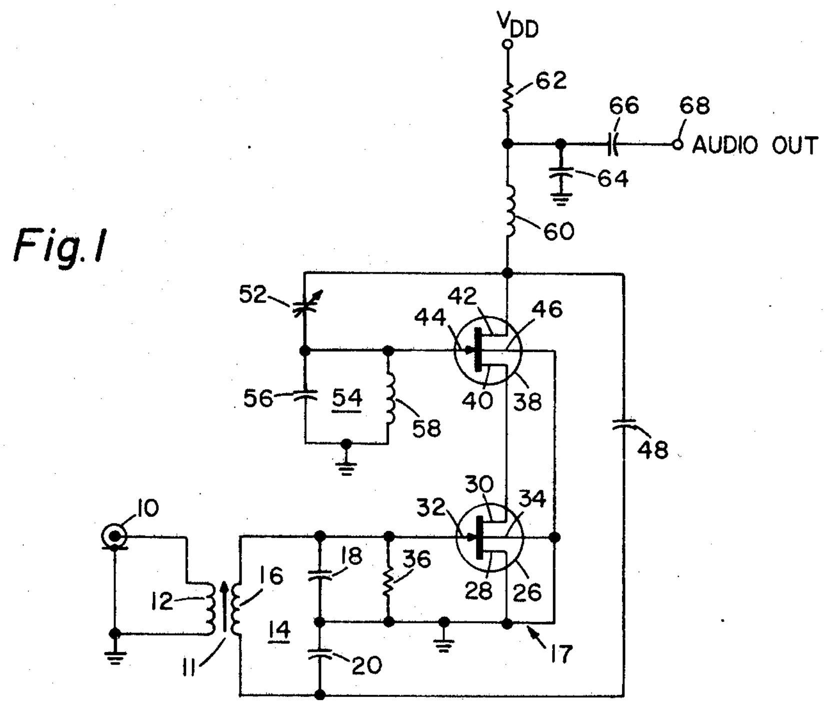
FIG. 1 is a schematic diagram of the FM detector circuit constructed in accordance with this invention and includes two cascode connected junction field-effect transistors.

Referring to the accompanying drawing in somewhat more detail, and input terminal 10 is connectable to a source of FM signals, and an input transformer connection 11 consisting of windings 12 and 16 couples an input FM signal to the Colpitts type oscillator portion 17 of the detector. The winding 16 is part of the Colpitts type oscillator tank circuit 14 which also includes capacitors 18 and 20 connected as shown to a common point of reference potential. The signal on the upper plate of capacitor 18 is 180 degrees out of phase with the signal on the lower plate of capacitor 20, and this 180 degree phase shift is necessary to sustain oscillations in the detector circuit. The Colpitts type oscillator circuit further includes a first junction field-effect transistor (JFET) 26 having source and drain electrodes 28 and 30 and first and second gate electrodes 32 and 34, respectively. The first or input gate electrode 32 is connected to receive the incoming FM signal from the tank circuit 14 which is tuned to the FM carrier frequency. A bias resistor 36 is connected between the input or first gate electrode 32 and ground potential, and the second gate electrode 34 is connected directly to ground potential.

The first junction field-effect transistor 26 is connected in cascode with a second junction field-effect transistor 38. The second junction field-effect transistor 38 includes a drain electrode 42 which is coupled to a load resistor 62 via high frequency choke coil 60 and a second gate electrode 46 which is tied to ground potential. The first gate electrode 44 is connected to an LC tank circuit 54 including capacitor 56 and inductor 58, and a feedback capacitor 52 is connected between the drain electrode 42 and the first gate electrode 44; the feedback capacitor 52 provides the ninety degree phase shift between these two last-named electrodes and provides the necessary excitation for the LC tank circuit 54. If desired, the tank circuit 54 could be replaced with a crystal. The signal at the first gate electrode of the second junction field-effect transistor 38 is in phase quadrature with the signal at the first gate of the first junction field-effect transistor 26, and the LC tank circuit 54 resonates at the same frequency as the Colpitts oscillator tank circuit 14. The capacitor 48 is a coupling capacitor and introduces no substantial phase difference in the signal at the hot end of the high frequency choke coil 60 and the Colpitts tank circuit 14. Due to the AC coupling capacitor 48 between the Colpitts oscillator configuration and the output of the JFET 38, the signal introduced into the JFET 32 and output signal of the JFET 38 are in phase reversal with no frequency modulation impressed upon the incoming signal.

With no frequency modulation impressed on the incoming signal, the maximum amplitude of the audio output signal which has been integrated by shunt capacitor 64 and coupled through DC blocking capacitor 66 is constant. However, when the incoming carrier signal applied to input terminal 10 is frequency modulated, the quadrature phase relationship between the signal appearing on the first gate 32 of the first JFET 26 and the first gate 44 of the second JFET 38 is shifted about the ninety degree point. This phase variation produces a corresponding amplitude variation in the audio output signal at terminal 68 which is dependent directly upon the FM modulation impressed on the incoming carrier.

Figure 2:
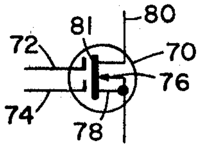
FIG. 2 is a schematic diagram of an insulated gate field effect transistor (IGFET) series tetrode device which may be substituted for the two JFET's in FIG. 1 and which may be built on a single chip of semiconductor material.

FIG. 2 represents an insulated gate field-effect transistor (IGFET) 70 which is sometimes referred to as a metal oxide-silicon field-effect transistor (MOSFET). This field-effect transistor 70 has first and second input gate electrodes 72 and 74 and a substrate gate 76 to which is tied the grounded source terminal 78. The IGFET 70 also has a drain electrode 80 from which a varying amplitude signal may be derived, and the IGFET 70 is essentially equivalent to the series connected JFET's 26 and 38 in FIG. 1. When the tetrode IGFET 70 is used, the device can be built on a single chip of semiconductor material, and the cascode connection between electrodes is made internally within the device in the channel 81 of single conductivity semiconductor material. The circuits described above which use either JFET's 26 and 38 or the IGFET 70 each exhibit good AM rejection and substantially linear transfer characteristics.

Figure 3:
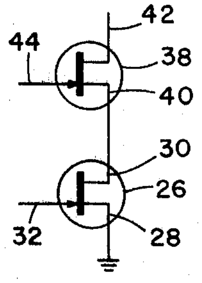
FIG. 3 illustrates an alternative cascode connection for the circuit of FIG. 1 using junction field-effect transistors wherein each transistor has a single gate electrode.

FIG. 3 illustrates an alternative junction field-effect transistor cascode connection wherein each junction field-effect transistor 26 and 38 is illustrated as having a single input electrode 32 and 44, respectively. However, such illustration is used when the substrate gate of each device (not shown) is connected to the input signal gate and such a connection gives a higher transconductance ($g_m$) since the voltage on each gate of each device controls the conductivity in the channel region of the FET. The FET devices of FIG. 1 can be built on a single chip of semiconductor material because the substrate gates thereof are grounded. This is not possible using the connection shown in FIG. 3 because of the gate connections described above.

Figure 4:
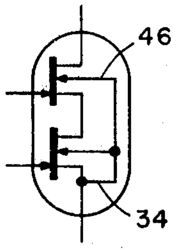
FIG. 4 illustrates another alternative cascode connection for the circuit of FIG. 1 wherein each of the cascoded junction field-effect transistors is constructed on a single chip of semiconductor material and has a grounded gate electrode and a signal gate electrode.

The device represented in FIG. 4 that of two JFET's on a single semiconductor chip and such construction is made possible, as mentioned above, because the substrate gates 46 and 34 are grounded.

The following is a table of component values used in a circuit of the type shown in FIG. 1 which was actually built and successfully tested. However, this table should not be construed as limiting the scope of this invention.

TABLE

| | | Value |
|---|---|---|
| Resistor: | | |
| R36 | megohm | 1 |
| R62 | kilohms | 15 |
| Capacitor: | | |
| C18 | picofarads | 240 |
| C20 | do | 27 |
| C48 | do | 100 |
| C52 | | Variable |
| C56 | picofarads | 300 |
| C64 | microfarads | .001 |
| C66 | do | .1 |
| Inductor: | | |
| L58 | microhenrys | 3.3 |
| L60 | do | 36 |

The transformer 11 was hand wound and the inductance value thereof was not measured.

I claim:

1. A self-oscillating FM product detector, including in combination:

(a) first field-effect transistor means connected in an oscillator circuit which is operative to receive frequency modulated signals, (b) second field-effect transistor means connected in cascode with said first field-effect transistor means and connected to a resonant circuit which is operative to resonate at the frequency of said oscillator circuit and in phase quadrature therewith with no frequency modulation impressed on the incoming signal which is applied to said oscillator circuit, (c) feedback circuit means connected between said second field-effect transistor means and said oscillator circuit for coupling a feedback signal to said oscillator circuit which is in phase reversal with the oscillations produced by said oscillator circuit with no frequency modulation impressed on the incoming signal, the receiving of frequency modulated signals by the oscillator circuit causing variations about phase quadrature between the signal of said resonant circuit and the oscillations of said oscillator circuits, said variations about phase quadrature providing signal interaction in said first and second field-effect transistor means and conduction angle variation in the signal at the output of said second transistor means, (d) output circuit means connected to the output of said second field-effect transistor means for converting the conduction angle variation in the output signal of said second transistor to an amplitude varying signal, the amplitude variation being determined by the frequency modulation of the signal received by said oscillator circuit.

2. The detector circuit according to claim 1 wherein:

(a) said first and second field-effect transistor means are constructed with first and second series channel regions adjacent to source and substrate gate regions; both of said source and substrate gate regions are connected to a point of reference potential, (b) a single drain electrode adjacent said second channel region and connectable to said output circuit means, (c) first and second insulated gates coupled to said first and second series channel regions respectively, and (d) said first gate connectable to said oscillator circuit for receiving local oscillations therefrom and said second gate connectable to said resonant circuit for receiving a signal therefrom in phase quadrature with the signal on said first gate with no frequency modulation imposed upon the incoming signal.

3. The detector circuit according to claim 1 wherein:

(a) said first and second field-effect transistor means includes respectively a first junction field-effect transistor having source, gate and drain electrodes and a second junction field-effect transistor having source, gate and drain electrodes, (b) said source electrode of said first junction field-effect transistor connected to a point of reference potential and said drain electrode of said first junction field-effect transistor connected to said source electrode of said second junction field-effect transistor, said drain electrode of said second junction field-effect transistor connectable to said output circuit means, and (c) said gate electrode of said first junction field-effect transistor connectable to receive oscillations from said oscillator circuit and said gate electrode of said second junction field-effect transistor connectable to receive signals from said resonant circuit.

4. The detector circuit according to claim 1 wherein:

(a) said first and second field-effect transistor means includes respectively first and second junction field-effect transistors connected source-to-drain in series on a single substrate gate region to which is connected the source region of said first junction field-effect transistor at a point of reference potential, and (b) said first and second junction field-effect transistors each having an input gate electrode, one of the input gate electrodes connectable to said oscillator circuit for receiving frequency modulated oscillations therefrom and the other input gate electrode connected to said resonant circuit for receiving a signal therefrom.

5. The detector circuit according to claim 1 wherein:

(a) said first field-effect transistor means includes a first junction field-effect transistor having source, drain and at least two gate electrodes, one of which is coupled within said oscillator circuit and coupled to receive FM oscillations produced by the frequency modulation impressed on the incoming signal, and (b) said second field-effect transistor means includes a second junction field-effect transistor having source, drain and at least two gate electrodes, one of which is connected to receive a signal from said resonant circuit to which it is connected and the signal from said resonant circuit being identical in frequency with the oscillations of said oscillator circuit and varying about phase quadrature with respect to said oscillations with no frequency modulation applied.

6. The detector circuit according to claim 5 wherein:

(a) said first field-effect transistor is connected source-to-drain in series with said second field-effect transistor, (b) said oscillator circuit comprising a Colpitts type oscillator circuit connection between the source and gate electrodes of said first field-effect transistor, (c) said resonant circuit connected between said gate electrode of said second field-effect transistor and a point of reference potential and capacitively coupled to said drain electrode of said second field-effect transistor for receiving an exciting potential therefrom and producing a signal in phase quadrature with the signal at said drain electrode of said second field-effect transistor with no frequency modulation impressed on the incoming signal, (d) a coupling capacitor connected between the drain electrode of said second field-effect transistor and a tank circuit within said Colpitts oscillator circuit connection for establishing an AC feedback path between said tank circuit and said drain electrode of said second field-effect transistor, and (e) said output circuit means including an integrating capacitor coupled to the drain electrode of said second field-effect transistor for producing a usable audio output signal.

References Cited

UNITED STATES PATENTS

| | | | |
|---|---|---|---|
| 2,351,192 | 6/1944 | Crosby | 329—124 X |
| 3,371,290 | 2/1968 | Kibler | 307—304 X |

ROY LAKE, Primary Examiner

L. J. DAHL, Assistant Examiner

U.S. Cl. X.R.

329—150